(12) United States Patent
Sasaki

(10) Patent No.: US 8,331,177 B2
(45) Date of Patent: Dec. 11, 2012

(54) RESISTANCE SEMICONDUCTOR MEMORY DEVICE HAVING A BIT LINE SUPPLIED WITH A COMPENSATING CURRENT BASED ON A LEAK CURRENT DETECTED DURING A FORMING OPERATION

(75) Inventor: Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 13/051,110

(22) Filed: Mar. 18, 2011

(65) Prior Publication Data

US 2011/0235396 A1   Sep. 29, 2011

(30) Foreign Application Priority Data

Mar. 24, 2010 (JP) ................................. 2010-067348

(51) Int. Cl.
*G11C 29/00* (2006.01)
(52) U.S. Cl. .... 365/201; 365/148; 365/163; 365/189.09
(58) Field of Classification Search .................. 365/148, 365/163, 189.09, 189.11, 201
See application file for complete search history.

(56) References Cited

U.S. PATENT DOCUMENTS

| | | | | |
|---|---|---|---|---|
| 5,793,695 | A * | 8/1998 | Kohno | 365/230.06 |
| 7,558,099 | B2 | 7/2009 | Morimoto | |
| 7,697,317 | B2 | 4/2010 | Shimaoka et al. | |
| 7,995,371 | B2 * | 8/2011 | Rinerson et al. | 365/148 |
| 8,072,795 | B1 * | 12/2011 | Wang et al. | 365/148 |
| 2012/0075910 | A1 * | 3/2012 | Yasuda | 365/148 |

OTHER PUBLICATIONS

U.S. Appl. No. 12/885,815, filed Sep. 20, 2010, Takahiko Sasaki.
U.S. Appl. No. 12/884,965, filed Sep. 17, 2010, Koji Hosono et al.

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A semiconductor memory device includes a memory cell array, a first control circuit, and a second control circuit. The first control circuit is configured to apply a first voltage to a selected first line. The second control circuit is configured to apply a second voltage having a voltage value higher than that of the first voltage to a selected second line. The first control circuit includes a detecting circuit. The detecting circuit is configured to detect a leak current to flow from the second line to the first line through a memory cell during a forming operation for bringing the memory cell into a state that allows the memory cell to shift between a high resistance state and a low resistance state. The second control circuit includes a current supply circuit, and a compensating circuit. The current supply circuit is configured to supply a constant current to the second line during the forming operation. The compensating circuit is configured to supply a compensating current having the same current value as that of the leak current to the second line during the forming operation based on the leak current detected by the detecting circuit.

20 Claims, 4 Drawing Sheets

US 8,331,177 B2

RESISTANCE SEMICONDUCTOR MEMORY DEVICE HAVING A BIT LINE SUPPLIED WITH A COMPENSATING CURRENT BASED ON A LEAK CURRENT DETECTED DURING A FORMING OPERATION

CROSS REFERENCE TO RELATED APPLICATIONS

This application is based on and claims the benefit of priority from prior Japanese Patent Application No. 2010-67348, filed on Mar. 24, 2010, the entire contents of which are incorporated herein by reference.

FIELD

Embodiments described herein relate generally to a semiconductor memory device including electrically-rewritable memory cells and to a semiconductor device.

BACKGROUND

Conventionally, a flash memory having a memory cell array configured by NAND connection or NOR connection of memory cells each having a floating gate structure has been well-known as an electrically rewritable nonvolatile memory. Also, a ferroelectric memory has been known as a memory that is nonvolatile and can be randomly accessed at a high speed.

Meanwhile, a variable resistance memory using a variable resistance element in each memory cell has been proposed as a technique for progressing miniaturization of memory cells. Known variable resistance elements include a phase change memory element, an MRAM element, a polymer ferroelectric RAM (PFRAM) memory element, a ReRAM element, etc. The phase change memory element changes its resistance value in accordance with state changes of a chalcogenide compound between a crystalline state and an amorphous state. The MRAM element uses resistance changes caused by a tunnel magnetoresistance effect. The PFRAM memory element has a resistance element made of a conductive polymer. The ReRAM element causes resistance changes in response to electric pulse application.

In the variable resistance memory, memory cells can be each configured by a series-connected circuit between a variable resistance element and a diode instead of a transistor. Therefore, it can be stacked easily. In addition, the variable resistance memory is advantageous in that it can be highly integrated by being formed in a three-dimensional structure.

Immediately after it is manufactured, the variable resistance element of the variable resistance memory has a very high resistance value and exists in a state that does not allow the resistance value to be easily changed. Hence, it is necessary to perform a forming operation that applies a high voltage (a forming voltage) to the variable resistance element. The forming operation generates a state that allows the resistance value of the variable resistance element to shift between a high resistance state and a low resistance state, and thereby enables the variable resistance element to function as a memory cell.

However, since a forming voltage is a high voltage, a leak current from the variable resistance element becomes large. Hence, there is a problem that a forming voltage equal to or higher than a certain value cannot be applied across both ends of the variable resistance element, and an accurate forming operation cannot be executed on the variable resistance element.

DETAILED DESCRIPTION

A semiconductor memory device includes a memory cell array, a first control circuit, and a second control circuit. The memory cell array includes memory cells each having a variable resistance element, the memory cells arranged at intersections of a plurality of first lines and a plurality of second lines, respectively. The first control circuit is configured to apply a first voltage to a selected first line. The second control circuit is configured to apply a second voltage having a voltage value higher than that of the first voltage to a selected second line. The first control circuit includes a detecting circuit. The detecting circuit is configured to detect a leak current to flow from the second line to the first line through a memory cell during a forming operation for bringing the memory cell into a state that allows the memory cell to shift between a high resistance state and a low resistance state. The second control circuit includes a current supply circuit, and a compensating circuit. The current supply circuit is configured to supply a constant current to the second line during the forming operation. The compensating circuit is configured to supply a compensating current having the same current value as that of the leak current to the second line during the forming operation based on the leak current detected by the detecting circuit.

A semiconductor device according to one aspect controls a memory cell array. The memory cell array includes memory cells each having a variable resistance element, the memory cells arranged at intersections of a plurality of first lines and a plurality of second lines, respectively. The semiconductor device includes a first control circuit and a second control circuit. The first control circuit applies a first voltage to a selected first line. The second control circuit applies a second voltage having a voltage value higher than that of the first voltage to a selected second line. The first control circuit includes a detecting circuit. The detecting circuit detects a leak current to flow from the second line to the first line through a memory cell during a forming operation for bringing the memory cell into a state that allows the memory cell to shift between a high resistance state and a low resistance state. The second control circuit includes a current supply circuit and a compensating circuit. The current supply circuit supplies a constant current to the second line during the forming operation. The compensating circuit supplies a compensating current having the same current value as that of the leak current to the second line during the forming operation based on the leak current detected by the detecting circuit.

A semiconductor memory device according to an embodiment will now be explained with reference to the drawings.

[Configuration]

Figure 1:
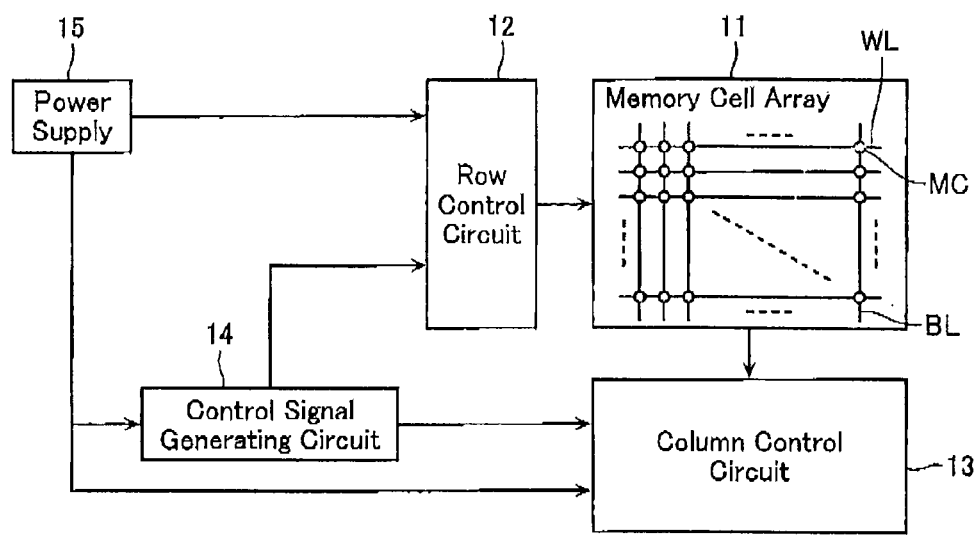
FIG. 1 is a block diagram of a semiconductor memory device according to an embodiment.

FIG. 1 is a block diagram of a semiconductor memory device according to the present embodiment. As shown in FIG. 1, the semiconductor memory device according to the first embodiment includes a memory cell array 11, a row control circuit 12, a column control circuit 13, a control signal generating circuit 14, and a power supply 15.

The memory cell array 11 includes: a plurality of word lines WL; a plurality of bit lines BL intersecting the word liens WL; and memory cells MC provided at the intersections of the bit lines BL and the word lines WL. The row control circuit 12 applies voltages necessary for various operations to a selected word line WL. The column control circuit 13 applies voltages higher than the voltages of the word line WL and necessary for various operations to a selected bit line BL. The column control circuit 13 includes a sense amplifier circuit configured to determine the data retained by the memory cell MC by sensing and amplifying a signal that appears on the bit line BL.

The control signal generating circuit 14 supplies a row address and a column address to the row control circuit 12 and the column control circuit 13 respectively. The power supply 15 supplies a power supply voltage to the row control circuit 12, the column control circuit 13, and the control signal generating circuit 14.

Figure 2:
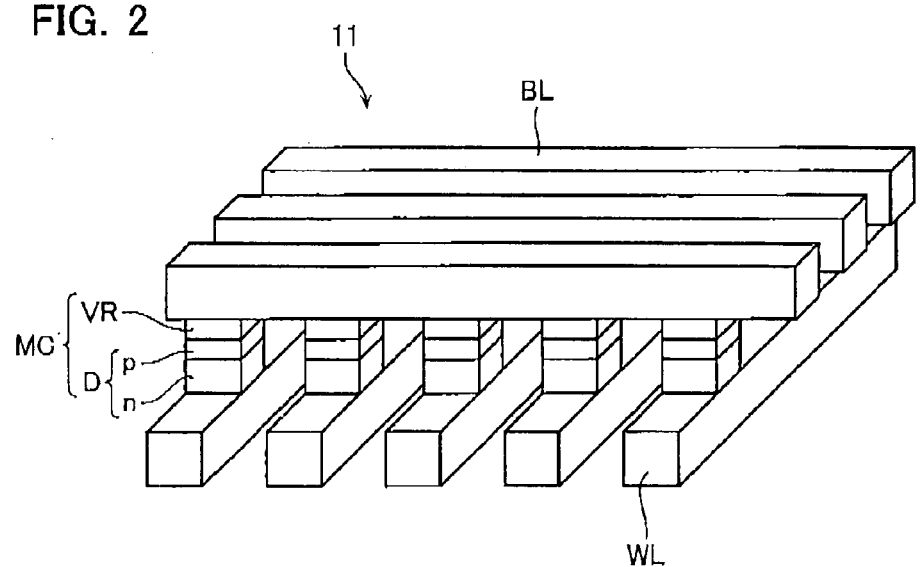
FIG. 2 is a perspective diagram showing a part of a memory cell array 11 shown in FIG. 1.

FIG. 2 is a perspective diagram showing a part of the memory cell array 11 shown in FIG. 1. The memory cell array 11 includes: a plurality of word lines WL provided in parallel; a plurality of bit lines BL intersecting the word lines WL; and unipolar type memory cells MC provided at the intersections of the word lines WL and the bit lines BL. The memory cell MC is constituted by: a variable resistance element VR configured to shift between at least two resistance states, namely a low resistance state and a high resistance state; and a selecting element such as a diode D configured by a non-ohmic element. The present invention is not limited to a unipolar type memory cell MC, but can be applied to a semiconductor memory device including a bipolar type memory cell MC. The semiconductor memory device according to the present embodiment shown in FIG. 2 has a so-called cross-point type configuration.

In this configuration, the plurality of word lines WL and the plurality of bit lines BL both respectively have a line-and-space pattern, and it is only necessary that the word lines WL and the bit lines BL intersect each other. Hence, there is no need of strictly concerning misalignment in the word line WL direction and the bit line BL direction. Accordingly, the memory cell array can be easily manufactured with extremely loose demand for positioning accuracy in the array.

The variable resistance element VR may be any of a PCRAM, CBRAM, ReRAM, etc. to be described from now. A PCRAM changes its resistance value based on phase changes of chalcogenide or the like between a crystalline state and an amorphous state. A CBRAM changes its resistance value by forming a bridge (a conducting bridge) between electrodes by precipitating metal cations and destroying the bridge by ionizing the precipitated metal. A ReRAM changes its resistance value in response to voltage or current application. ReRAM is roughly divided into two types. One type changes its resistance value in accordance with presence or absence of charges trapped in a charge trap existing at an electrode interface. The other type changes its resistance value in accordance with presence or absence of a conductive path due to oxygen loss. ReRAM may be made of $ZnMn_2O_4$, $NiO$, $TiO_2$, $SrZrO_2$, $Pr_{0.7}Ca_{0.3}MnO_3$, etc.

Immediately after it is manufactured, the variable resistance element VR has a very high resistance value and exists in a state that does not allow the resistance value to be easily changed. Hence, a forming operation is executed on the variable resistance element VR in order to enable the variable resistance element VR to realize various operations as a memory cell MC. In the forming operation, a forming voltage Vform is applied to the variable resistance element VR to cause a large current through the variable resistance element VR. This large current forms a filament path (a current path) in the variable resistance element VR. After the forming operation, the filament path in the variable resistance element VR is repetitively cut and restored in response to application of a certain voltage to the memory cell MC. This enables the variable resistance element VR to shift between a low resistance state and a high resistance state.

As regards a unipolar type ReRAM, a set operation (data writing) in the memory cell MC is executed by applying a set voltage Vset of, for example, 3.5V to the variable resistance element VR (actually about 4.5V if a voltage drop to the diode D is included) to cause a current of about 10 nA to flow for about 10 ns to 100 ns. This changes the variable resistance element VR from a high resistance state to a low resistance state.

On the other hand, a reset operation (data erasing) in the memory cell MC is executed by applying a reset voltage Vreset of 0.8V to the variable resistance element VR in the low resistance state generated by the set operation (actually about 2.0V if a voltage drop to the diode D is included) to cause a current of about 1 μA to 10 μA to flow for about 500 ns to 2 μs. This changes the variable resistance element VR from the low resistance state to the high resistance state.

A read operation (data reading) in a memory cell MC is executed by supplying a read voltage Vread of 0.4V to the variable resistance element VR (actually about 1.4V if a voltage drop to the diode D is included) and monitoring a current to flow through the variable resistance element VR by the sense amplifier. Thereby, it is determined whether the variable resistance element VR is in the low resistance state or in the high resistance state.

Voltages corresponding to the operations described above (a forming voltage Vform, a set voltage Vset, a reset voltage Vreset, and a read voltage Vread) are applied to the bit lines BL of the memory cell array 11 shown in FIG. 1 through the column control circuit 13 based on a column address sent by the control signal generating circuit 14.

Figure 3:
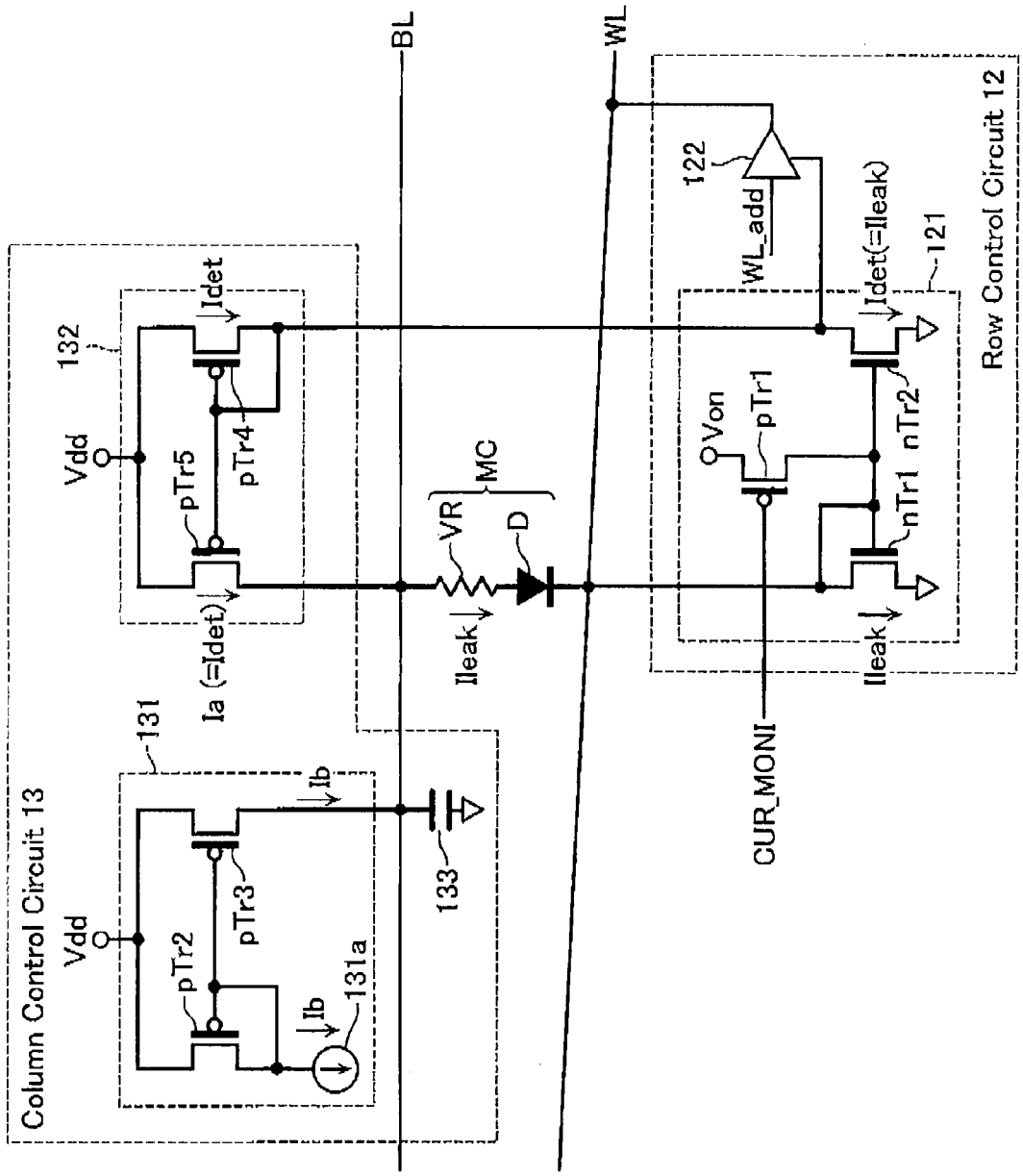
FIG. 3 is a circuit diagram showing a row control circuit 12 and a column control circuit 13 of the semiconductor memory device according to the embodiment.

Next, the circuit configuration of the first embodiment will be explained specifically with reference to FIG. 3. FIG. 3 is a circuit diagram showing the row control circuit 12 and the column control circuit 13 of the semiconductor memory device according to the present embodiment. FIG. 3 shows the configuration of the row control circuit 12 and the column control circuit 13 provided for one bit line BL and one word line WL. The row control circuit 12 and the column control circuit 13 may be provided for each bit line BL and each word line WL as in this case, or the row control circuit 12 and the column control circuit 13 may be shared by a plurality of bit lines BL and a plurality of word lines WL.

The row control circuit 12 includes a detecting circuit 121 and a driver 122. The detecting circuit 121 detects a leak current Ileak that flows from the bit line BL to the word line WL through the memory cell MC during the forming operation. The detecting circuit 121 includes an NMOS transistor nTr1 and nTr2 and a PMOS transistor pTr1.

The NMOS transistor nTr1 is connected between the word line WL and a ground terminal, and is diode-connected. The NMOS transistor nTr1 shares the gate with the NMOS transistor nTr2. That is, the NMOS transistor nTr2 is mirror-connected to the NMOS transistor nTr1. The source of the NMOS transistor nTr2 is connected to a ground terminal. The NMOS transistor nTr1 and the NMOS transistor nTr2 have the same size.

The source of the PMOS transistor pTr1 is applied with a voltage Von. The gate of the PMOS transistor pTr1 receives a signal CUR_MONI as an input. The drain of the PMOS transistor pTr1 is connected to the gate of the NMOS transistors nTr1 and nTr2. In response to the signal CUR_MONI becoming "H" during the forming operation, the PMOS transistor pTr1 becomes nonconductive. In response to the signal CUR_MONI becoming "L" during the other operations (a set operation, a reset operation, and a read operation), the PMOS transistor pTr1 becomes conductive. That is, only during the operations other than the forming operation, the gate of the NMOS transistors nTr1 and nTr2 is applied with the voltage Von to make the NMOS transistors nTr1 and nTr2 conductive. Hence, a leak current Ileak to flow through the NMOS transistor nTr1 is mirrored to the NMOS transistor nTr2 as a detected current Idet only during the forming operation. The detected current Idet has the same current value as that of the leak current Ileak.

The ground terminal of the driver 122 is connected to the drain of the NMOS transistor nTr2. The input terminal of the driver 122 receives a signal WL_Add. The output terminal of the driver 122 is connected to the word line WL. The driver 122 supplies a certain voltage to the word line WL based on the signal WL_Add except during the forming operation.

The column control circuit 13 includes a current supply circuit 131, a compensating circuit 132, and a capacitor 133. The current supply circuit 131 supplies a constant current Ib to a selected bit line BL. The compensating circuit 132 supplies a compensating current Ia having the same current value as that of the leak current Ileak to the bit line BL during the forming operation based on the leak current Ileak detected by the detecting circuit 121. The capacitor 133 is connected between the bit line BL and a ground terminal.

The current supply circuit 131 includes a constant current source 131a, and PMOS transistors pTr2 and pTr3. The constant current source 131a generates the constant current Ib during the forming operation. The PMOS transistor pTr2 is connected between a power supply terminal (Vdd) and the constant current source 131a, and is diode-connected. The PMOS transistor pTr2 shares the gate with the PMOS transistor pTr3. That is, the PMOS transistor pTr3 is mirror-connected to the PMOS transistor pTr2. The PMOS transistor pTr3 is provided between the power supply terminal (Vdd) and the bit line BL. The PMOS transistor pTr2 and the PMOS transistor pTr3 have the same size. Hence, the constant current Ib to flow through the PMOS transistor pTr2 is mirrored to the PMOS transistor pTr3 to be supplied to the bit line BL.

The compensating circuit 132 includes a PMOS transistors pTr4 and pTr5. The PMOS transistor pTr4 is connected between a power supply terminal (Vdd) and the NMOS transistor nTr2, and is diode-connected. The PMOS transistor pTr4 shares the gate with the PMOS transistor pTr5. That is, the PMOS transistor pTr5 is mirror-connected to the PMOS transistor pTr4. The PMOS transistor pTr5 is provided between the power supply terminal (Vdd) and the bit line BL. The PMOS transistor pTr4 and the PMOS transistor pTr5 have the same size. Hence, the detected current Idet to flow through the PMOS transistor pTr4 is mirrored to the PMOS transistor pTr5 as the compensating current Ia to be supplied to the bit line BL. The compensating current Ia has the same current value as that of the detected current Idet and the leak current Ileak.

[Operation]

Figure 4:
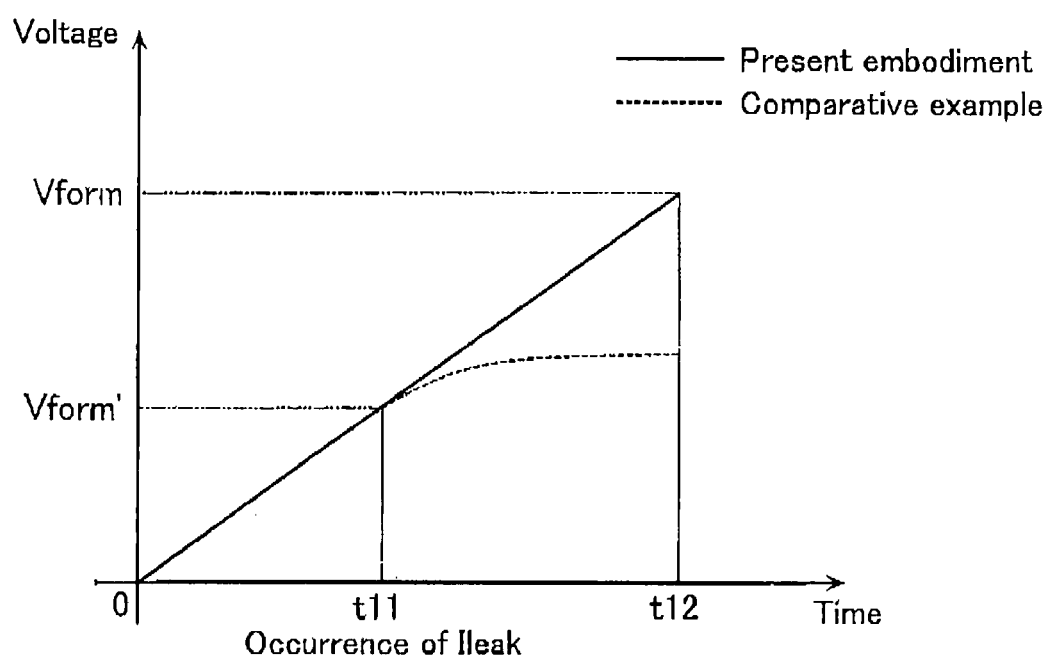
FIG. 4 is a diagram showing a relationship between a voltage applied to a bit line BL during a forming operation and time.

Next, an operation according to the present embodiment will be explained with reference to FIG. 3 and FIG. 4. FIG. 4 is a diagram showing a relationship between the voltage to be charged to the bit line BL during the forming operation and the time.

It is desirable that the voltage to be applied to the memory cell MC during the forming operation be raised to the certain forming voltage Vform gradually over a long time of about 10 μs, because this can improve the switching characteristic of the memory cell MC. For example, if the voltage is rapidly raised over a short time of less than 10 μs, appropriate forming might become unavailable because of excessive lowering of the resistance of the memory cell MC, etc.

On the other hand, if the voltage to be applied to the memory cell MC is raised gradually over a long time during the forming operation, the leak current Ileak to flow from the bit line BL to the word line WL through the memory cell MC becomes large, which makes it impossible for a required high voltage to be applied to the memory cell MC. Hence, the present embodiment solves the problem by providing the detecting circuit 121 and the compensating circuit 132 to supply the compensating current Ia having the same current value as that of the leak current Ileak to the bit line BL.

As shown in FIG. 4, when the forming operation is started, first, the current supply circuit 131 starts supplying the constant current Ib to the bit line BL, which is hence going to be charged. When the bit line BL is charged up to a certain voltage Vform' at the timing t11, a leak current Ileak occurs and leaks from the memory cell MC.

Here, a consideration will be given to a comparative example in which the detecting circuit 121 and the compensating circuit 132 are not provided. In this comparative example, the constant current Ib is constantly supplied to the bit line BL but meanwhile the leak current Ileak increases over time. Then, when the leak current Ileak becomes equal to the constant current Ib, the voltage of the bit line BL stops rising any longer. For example, as indicated by the broken line in FIG. 4, the voltage of the bit line BL converges from the timing t11 and will not reach the target forming voltage Vform.

On the other hand, in the present embodiment, the voltage of the bit line BL rises as indicated by the solid line in FIG. 4 and reaches the forming voltage Vform at the timing t12 owing to the detecting circuit 121 and the compensating circuit 132. Further, since the voltage of the bit line BL is raised up to the forming voltage Vform gradually over a long time of about 10 μs, the switching characteristic of the memory cell MC improves. That is, the present embodiment enables an accurate forming operation to be executed on the memory cell MC.

Specifically, according to the present embodiment, in response to the signal CUR_MONI changing from "L" to "H" during the forming operation, the detecting circuit 121 mirrors the leak current Ileak and starts supplying the detected current Idet. Then, the compensating circuit 132 further mirrors the detected current Idet and supplies it to the bit lie BL as the compensating current Ia(=Idet=Ileak).

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 5:
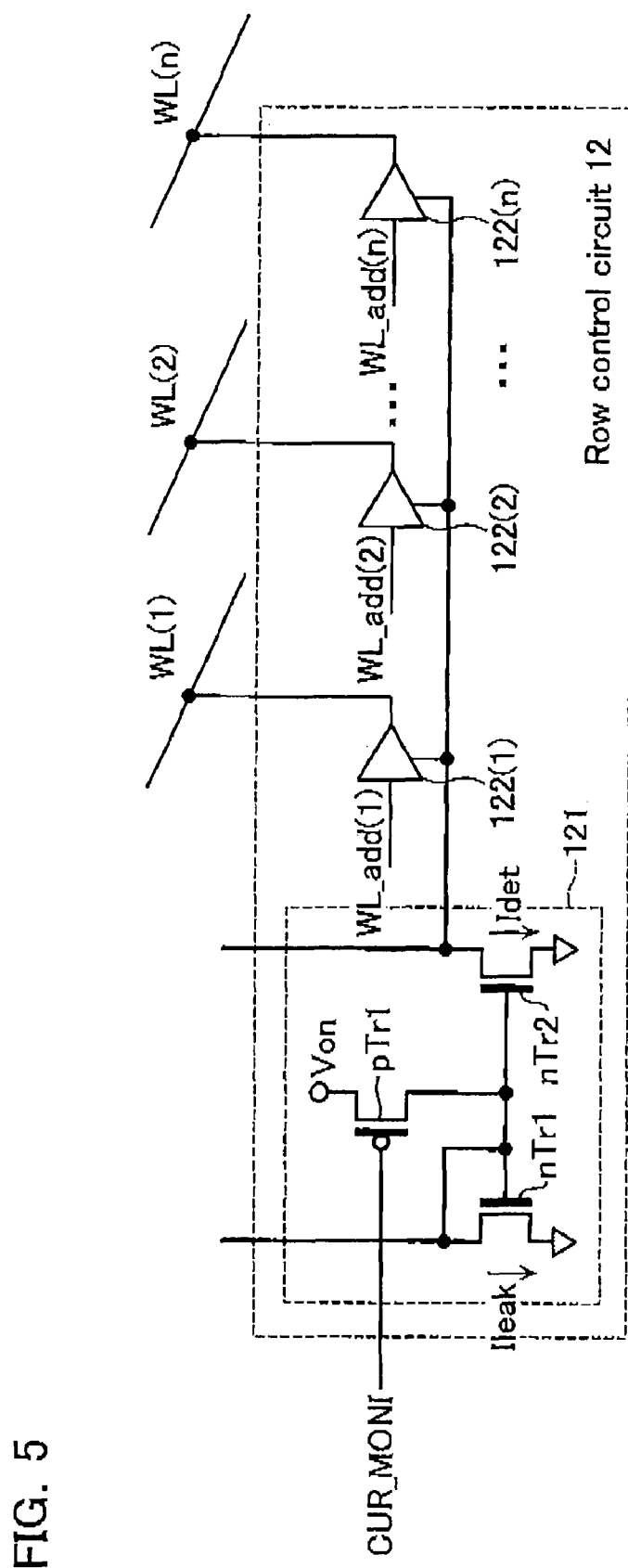
FIG. 5 is a circuit diagram showing a column control circuit 13 according to another embodiment.

For example, as shown in FIG. 5, the row control circuit 12 may include a plurality of drivers 122(1) to 122(n) (n being a natural number) In this case, the ground terminals of the drivers 122(1) to 122(n) are connected commonly to the drain of the NMOS transistor nTr2. The input terminals of the drivers 122(1) to 122(n) receive signals WL_Add(1) to WL_Add(n), respectively. The output terminals of the drivers 122(1) to 122(n) are connected to the word lines WL(1) to WL(n) respectively.

What is claimed is:

1. A semiconductor memory device, comprising:
   a memory cell array including memory cells each having a variable resistance element, the memory cells arranged at intersections of a plurality of first lines and a plurality of second lines, respectively;
   a first control circuit configured to apply a first voltage to a selected first line; and
   a second control circuit configured to apply a second voltage having a voltage value higher than that of the first voltage to a selected second line,
   the first control circuit including a detecting circuit configured to detect a leak current to flow from the second line to the first line through a memory cell during a forming operation for bringing the memory cell into a state that allows the memory cell to shift between a high resistance state and a low resistance state, and
   the second control circuit including:
   a current supply circuit configured to supply a constant current to the second line during the forming operation; and
   a compensating circuit configured to supply a compensating current having the same current value as that of the leak current to the second line during the forming operation based on the leak current detected by the detecting circuit.

2. The semiconductor memory device according to claim 1, wherein the detecting circuit includes:
   a first transistor configured to flow the leak current therethrough; and
   a second transistor mirror-connected to the first transistor and configured to flow therethrough a detected current having the same current value as that of the leak current.

3. The semiconductor memory device according to claim 2, wherein the detecting circuit further includes a third transistor configured to apply the first voltage to a common gate of the first transistor and the second transistor except during the forming operation, and
   the first voltage is a voltage for making the first transistor and the second transistor conductive.

4. The semiconductor memory device according to claim 2, wherein the second transistor flows the detected current from one end thereof to the other end thereof, and
   the detecting circuit further includes a driver connected to the one end of the second transistor.

5. The semiconductor memory device according to claim 4, wherein the detecting circuit includes a plurality of drivers, and
   one of the plurality of drivers is connected to one of the plurality of first lines.

6. The semiconductor memory device according to claim 2, wherein the compensating circuit includes:
   a fourth transistor configured to flow the detected current therethrough; and
   a fifth transistor mirror-connected to the fourth transistor and configured to flow the compensating current therethrough based on the detected current.

7. The semiconductor memory device according to claim 1, wherein the current supply circuit includes:
   a constant current source configured to generate the constant current during the forming operation;
   a sixth transistor having one end connected to the constant current source and configured to flow the constant current therethrough; and
   a seventh transistor mirror-connected to the sixth transistor and configured to flow the constant current therethrough.

8. The semiconductor memory device according to claim 1, wherein the second control circuit further includes a capacitor having one end connected to the second line and the other end connected to a ground terminal.

9. The semiconductor memory device according to claim 1, wherein the first control circuit and the second control circuit raises a voltage to be applied to the memory cell up to a forming voltage over a time of about 10 μs, thereby causing the memory cell to be shiftable between a high resistance state and a low resistance state.

10. The semiconductor memory device according to claim 1, wherein the memory cell further includes a rectifying element connected in series to the variable resistance element.

11. The semiconductor memory device according to claim 1, wherein the variable resistance element shifts from the high resistance state to the low resistance state when a set voltage is applied thereto, and shifts from the low resistance state to the high resistance state when a reset voltage lower than the set voltage is applied thereto.

12. A semiconductor device configured to control a memory cell array including memory cells each having a variable resistance element, the memory cells arranged at intersections of a plurality of first lines and a plurality of second lines, respectively, the semiconductor device comprising:
   a first control circuit configured to apply a first voltage to a selected first line; and
   a second control circuit configured to apply a second voltage having a voltage value higher than that of the first voltage to a selected second line,
   the first control circuit including a detecting circuit configured to detect a leak current to flow from the second line to the first line through a memory cell during a forming operation for bringing the memory cell into a state that allow the memory cell to shift between a high resistance state and a low resistance state, and
   the second control circuit including:
   a current supply circuit configured to supply a constant current to the second line during the forming operation; and
   a compensating circuit configured to supply a compensating current having the same current value as that of the leak current to the second line during the forming operation based on the leak current detected by the detecting circuit.

13. The semiconductor device according to claim 12, wherein the detecting circuit includes:
   a first transistor configured to flow the leak current therethrough; and
   a second transistor mirror-connected to the first transistor and configured to flow therethrough a detected current having the same current value as that of the leak current.

14. The semiconductor device according to claim 13,
wherein the detecting circuit further includes a third transistor configured to apply the first voltage to a common gate of the first transistor and the second transistor except during the forming operation, and
the first voltage is a voltage for making the first transistor and the second transistor conductive.

15. The semiconductor device according to claim 13,
wherein the second transistor flows the detected current from one end thereof to the other end thereof, and
the detecting circuit further includes a driver connected to the one end of the second transistor.

16. The semiconductor device according to claim 15,
wherein the detecting circuit includes a plurality of drivers, and
one of the plurality of drivers is connected to one of the plurality of first lines.

17. The semiconductor device according to claim 13,
wherein the compensating circuit includes:
a fourth transistor configured to flow the detected current therethrough; and
a fifth transistor mirror-connected to the fourth transistor and configured to flow the compensating current therethrough based on the detected current.

18. The semiconductor device according to claim 12,
wherein the current supply circuit includes:
a constant current source configured to generate the constant current during the forming operation;
a sixth transistor having one end connected to the constant current source and configured to flow the constant current therethrough; and
a seventh transistor mirror-connected to the sixth transistor and configured to flow the constant current therethrough.

19. The semiconductor device according to claim 12,
wherein the second control circuit further includes a capacitor having one end connected to the second line and the other end connected to a ground terminal.

20. The semiconductor device according to claim 12,
wherein the first control circuit and the second control circuit raises a voltage to be applied to the memory cell up to a forming voltage over a time of about 10 µs, thereby causing the memory cell to be shiftable between a high resistance state and a low resistance state.

* * * * *